(12) United States Patent
Tokunaga et al.

(10) Patent No.: US 7,394,156 B2
(45) Date of Patent: Jul. 1, 2008

(54) SEMICONDUCTOR INTEGRATED CIRCUIT DEVICE AND METHOD OF PRODUCING THE SAME

(75) Inventors: Shinya Tokunaga, Kyoto (JP); Shigeki Furuya, Osaka (JP); Yuuji Hinatsu, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 39 days.

(21) Appl. No.: 11/043,250

(22) Filed: Jan. 25, 2005

(65) Prior Publication Data

US 2005/0127406 A1     Jun. 16, 2005

Related U.S. Application Data

(63) Continuation of application No. 09/972,117, filed on Oct. 5, 2001, now Pat. No. 7,170,115.

(30) Foreign Application Priority Data

Oct. 17, 2000    (JP)    ............................ 2000-317038

(51) Int. Cl.
*H01L 23/48* (2006.01)
*H01L 23/52* (2006.01)
*H01L 29/40* (2006.01)
*H01L 27/10* (2006.01)
*H01L 29/73* (2006.01)
*H01L 29/74* (2006.01)

(52) U.S. Cl. .................... 257/758; 257/202; 257/204; 257/205; 257/206; 257/207; 257/208; 257/211; 257/335; 257/338; 257/341; 257/342; 257/350; 257/351; 257/357; 257/358; 257/359; 257/369; 257/371; 257/382; 257/373; 257/374; 257/375; 257/376; 257/377; 257/700; 257/759; 257/760; 257/905; 257/909

(58) Field of Classification Search ......... 257/204–208, 257/211, 341–342, 758–760, 335, 338, 350–351, 257/357–359, 369, 371–377, 700, 905, 909, 257/202

See application file for complete search history.

(56) References Cited

U.S. PATENT DOCUMENTS

| 4,851,361 | A | * | 7/1989 | Schumann et al. | ........... 438/201 |
| 5,171,713 | A | * | 12/1992 | Matthews | .................... 438/31 |
| 5,191,405 | A | * | 3/1993 | Tomita et al. | ............... 257/777 |
| 5,283,449 | A | | 2/1994 | Ooka | ......................... 257/204 |
| 5,311,048 | A | * | 5/1994 | Takahashi et al. | ........... 257/207 |
| 5,592,009 | A | | 1/1997 | Hidaka | ....................... 257/351 |

(Continued)

FOREIGN PATENT DOCUMENTS

JP     60-1844     1/1985

(Continued)

OTHER PUBLICATIONS

Form PTO-892 from corresponding parent case U.S. Appl. No. 09/972,117, mailed May 4, 2005 (1 page).

(Continued)

*Primary Examiner*—Ida M Soward
(74) *Attorney, Agent, or Firm*—Hamre, Schumann, Mueller & Larson, P.C.

(57) ABSTRACT

A semiconductor integrated circuit device has a plurality of CMOS-type base cells arranged on a semiconductor substrate and m wiring layers, and gate array type logic cells are composed of the base cells and the wiring layers. Wiring within and between the logic cells is constituted by using only upper n (n<m) wiring layers. It becomes possible to shorten a development period and reduce a development cost when a gate array type semiconductor integrated circuit device becomes large in scale.

9 Claims, 9 Drawing Sheets

U.S. PATENT DOCUMENTS

| | | | |
|---|---|---|---|
| 5,598,029 A * | 1/1997 | Suzuki | 257/665 |
| 5,734,187 A | 3/1998 | Bohr et al. | 257/377 |
| 5,786,638 A * | 7/1998 | Yamaha | 257/760 |
| 5,828,119 A * | 10/1998 | Katsube | 257/491 |
| 5,917,211 A | 6/1999 | Murata et al. | 257/296 |
| 5,990,507 A * | 11/1999 | Mochizuki et al. | 257/295 |
| 6,022,797 A * | 2/2000 | Ogasawara et al. | 438/622 |
| 6,028,360 A | 2/2000 | Nakamura et al. | 257/758 |
| 6,031,257 A * | 2/2000 | Noto et al. | 257/202 |
| 6,081,305 A * | 6/2000 | Sato et al. | 349/5 |
| 6,133,582 A * | 10/2000 | Osann et al. | 257/48 |
| 6,190,957 B1 | 2/2001 | Mochizuki et al. | 438/240 |
| 6,262,487 B1 | 7/2001 | Igarashi et al. | 257/758 |
| 6,265,778 B1 | 7/2001 | Tottori | 257/758 |
| 6,266,110 B1 | 7/2001 | Mizuno et al. | 349/111 |
| 6,288,447 B1 | 9/2001 | Amishiro et al. | 257/758 |
| 6,320,234 B1 * | 11/2001 | Karasawa et al. | 257/371 |
| 6,326,651 B1 * | 12/2001 | Manabe | 257/209 |
| 6,340,632 B1 | 1/2002 | Fukada et al. | 438/622 |
| 6,344,692 B1 | 2/2002 | Ikemasu et al. | 257/758 |
| 6,365,954 B1 * | 4/2002 | Dasgupta | 257/532 |
| 6,462,385 B1 * | 10/2002 | Kumagai | 257/372 |
| 6,476,897 B1 | 11/2002 | Watanabe et al. | 349/139 |
| 6,492,735 B1 | 12/2002 | Matsubara | 257/760 |
| 6,528,835 B1 * | 3/2003 | Kaeriyama | 257/296 |
| 6,717,267 B1 * | 4/2004 | Kunikiyo | 257/758 |
| 6,791,147 B1 * | 9/2004 | Karasawa et al. | 257/371 |
| 6,858,484 B2 * | 2/2005 | Nishihara et al. | 438/199 |
| 6,861,756 B2 | 3/2005 | Saito et al. | 257/762 |
| 7,064,439 B1 * | 6/2006 | Berthold et al. | 257/758 |
| 2001/0036737 A1 | 11/2001 | Iguchi et al. | 438/692 |
| 2001/0045651 A1 | 11/2001 | Saito et al. | 257/750 |
| 2001/0045655 A1 | 11/2001 | Matsubara | 257/758 |
| 2002/0053739 A1 | 5/2002 | Honma et al. | 257/758 |
| 2002/0195641 A1 | 12/2002 | Fukuda et al. | 257/306 |
| 2003/0148558 A1 | 8/2003 | Kubo et al. | 438/128 |
| 2003/0153187 A1 * | 8/2003 | Ohashi et al. | 438/692 |

FOREIGN PATENT DOCUMENTS

| | | |
|---|---|---|
| JP | 5-21738 | 1/1993 |
| JP | 5-190816 | 7/1993 |
| JP | 9-62725 | 3/1997 |
| JP | 2000-172738 | 6/2000 |
| JP | 2000-269341 | 9/2000 |

OTHER PUBLICATIONS

Notice of Allowance from corresponding parent case U.S. Appl. No. 09/972,117, mailed Sep. 20, 2006, (7 pages).

* cited by examiner

SEMICONDUCTOR INTEGRATED CIRCUIT DEVICE AND METHOD OF PRODUCING THE SAME

This application is a Continuation of application Ser. No. 09/972,117, filed Oct. 5, 2001, which application(s) are incorporated herein by reference.

BACKGROUND OF THE INVENTION

1. Field of the Invention

The present invention generally relates to a semiconductor integrated circuit device and a method of producing the same. More particularly, the present invention relates to a configuration of logic cells of a CMOS-type gate array and a method of producing functional blocks by using the logic cells.

2. Related Background Art

In recent years, semiconductor integrated circuit devices (hereinafter, referred to as an "LSI") have tended toward higher integration and higher performance along with a finer process. This causes the development cost and development period of an LSI to increase. Under such circumstances, an LSI including gate array cells is suitable for the shortening of a development period and the reduction in cost or the flexible production, and finds wide applications, because such a method of producing an LSI can be designed with only wiring patterns by using CAD or the like.

Hereinafter, the configuration of a conventional gate array LSI will be described with reference to the drawings. FIG. 9 is a sectional view showing a layout of conventional gate array cells. Reference numerals 940A and 940B denote CMOS-type base cells, respectively. Reference numeral 980 denotes N-channel transistor regions or P-channel transistor regions in the base cells 940A and 940B, and reference numeral 990 denotes gates. Wiring patterns are formed so as to connect the transistor regions 980 or the gates 990 to first wiring layers 201 through contact VIAs 101, whereby logic cells are formed.

The logic cells 900A and 900B constituted as described above have an arbitrary number of connecting pins 954 for connecting the logic cells to each other and are connected to each other through contact VIAs 112, second wiring layers 202, contact VIAs 123, and a third wiring layer 203. If required, it is possible to form logic cells of multi-layered wiring by connecting the first wiring layers 201 and the second wiring layers 202 through the contact VIAs 112 and the second wiring layers 202 and the third wiring layer 203 through the contact VIAs 123. In most cases, ordinary logic cells can be formed by using up to third wiring layers 203. In this case, it is appreciated that the logic cells are connected by using further upper wiring layers.

In producing the above-described gate array cells, the process of producing up to the base cells 940A and 940B is completed when the logic design of an LSI starts and a mask for wiring layers is produced (master slice system). From then, the remaining wiring process can be carried out, which results in a shortened development period and a reduction in the design cost of an LSI.

However, the configuration of the conventional gate array LSI and a production method thereof have the following problems.

Multi-layered wiring tends to be increased in the number of the wiring layers along with a recent finer process. For example, as shown in FIG. 9, when a functional block 400 is designed with five wiring layers and the logic cells 900A and 900B composed of a gate array have three wiring layers including connections between the logic cells, the logic cell 900B is connected to the functional block 400 through a contact VIA 134, a fourth wiring layer 204, a contact VIA 145, a fifth wiring layer 205, and a connecting pin 955.

Therefore, the period of a wiring process increases, and when logic corrections are needed, the number of correction masks increases, which prevents the shortening of a development period and the reduction in design cost that are characteristics of a gate array LSI.

SUMMARY OF THE INVENTION

It is an object of the present invention to provide a configuration of a semiconductor integrated circuit device and a method of producing the same that can shorten the development period and reduce the development cost when a gate array-type semiconductor integrated circuit device becomes large in scale.

The semiconductor integrated circuit device of the present invention has a basic configuration including a plurality of CMOS-type base cells arranged on a semiconductor substrate and m wiring layers, wherein gate array type logic cells are composed of the base cells and the wiring layers. In order to solve the above-described problem, wiring within and between the logic cells is constituted by using only upper n (n<m) wiring layers among the m wiring layers. Thus m is defined as the total number of the wiring layers used for forming the logic cells, constituting the wiring and so forth.

It is preferable that a connection cell having contact VIAs and wiring patterns disposed immediately above the contact VIAs and connected thereto are included in the lower (m−n) wiring layers, and the contact VIAs are disposed at positions corresponding to at least one grid of the base cells.

In the same way, a power supply cell including contact VIAs and wiring patterns connected to the contact VIAs and cells adjacent thereto also can be included in the lower (m−n) wiring layers, and the contact VIAs are disposed at positions corresponding to at least one grid of a power supply in the base cells.

In addition, a GND cell including contact VIAs and wiring patterns connected to the contact VIAs and cells adjacent thereto also can be included in the lower (m−n) wiring layers, and the contact VIAs are disposed at positions corresponding to at least one grid of a GND in the base cells.

In the above-described configuration, the semiconductor integrated circuit device also can be used by combining two or more kinds of connection cells, a power supply cell or a GND cell.

The method of producing a semiconductor integrated circuit device according to the invention is intended to produce the device having the above-mentioned configuration. The method includes preparing combinations LIB_K of the logic cells including the above-described connection cells. Each of the combinations LIB_K includes K connection cells in which K indicates one of integers from 1 to (m−n−1). The method further includes determining a layout of the elements for composing the device in the following manner. First, wiring layers used for wiring are determined and the combinations LIB_K including the connection cells corresponding to the determined wiring layers is selected. Then, an arrangement of the logic cells is determined, and after the logic cells roughly are wired, a wiring congestion degree is determined. Then, when the wiring congestion degree is higher or lower than a predetermined range, the logic cells are rearranged and roughly wired repeatedly by varying parameters of the wiring layers and selecting the combinations LIB_K for use again. When the wiring congestion degree is determined to be within an appropriate range, the logic cells are wired in detail. This allows the connection cells to be added or deleted automatically in accordance with the wiring congestion degree.

According to the method of producing a semiconductor integrated circuit device of the present invention having another configuration, a semiconductor integrated circuit device is produced that has a configuration in which any one, or a combination of two or more kinds of the connection cells, the power supply cell, or the GND cell is inserted into the lower (m–n) wiring layers and includes at least one functional block having a determined layout. Connection between the logic cells and the functional blocks, or between the functional blocks is conducted by using only the upper n (n<m) wiring layers among m wiring layers.

BRIEF DESCRIPTION OF THE DRAWINGS

FIG. 3A is a plan view of a base cell; FIG. 3B is a plan view of a connection cell; and FIG. 3C is a plan view showing a stacked state of FIGS. 3A and 3B.

FIG. 5A is a plan view of the base cell; FIG. 5B is a plan view of the power supply cell; and FIG. 5C is a plan view showing a stacked state of FIGS. 5A and 5B.

DETAILED DESCRIPTION OF THE INVENTION

Figure 1:
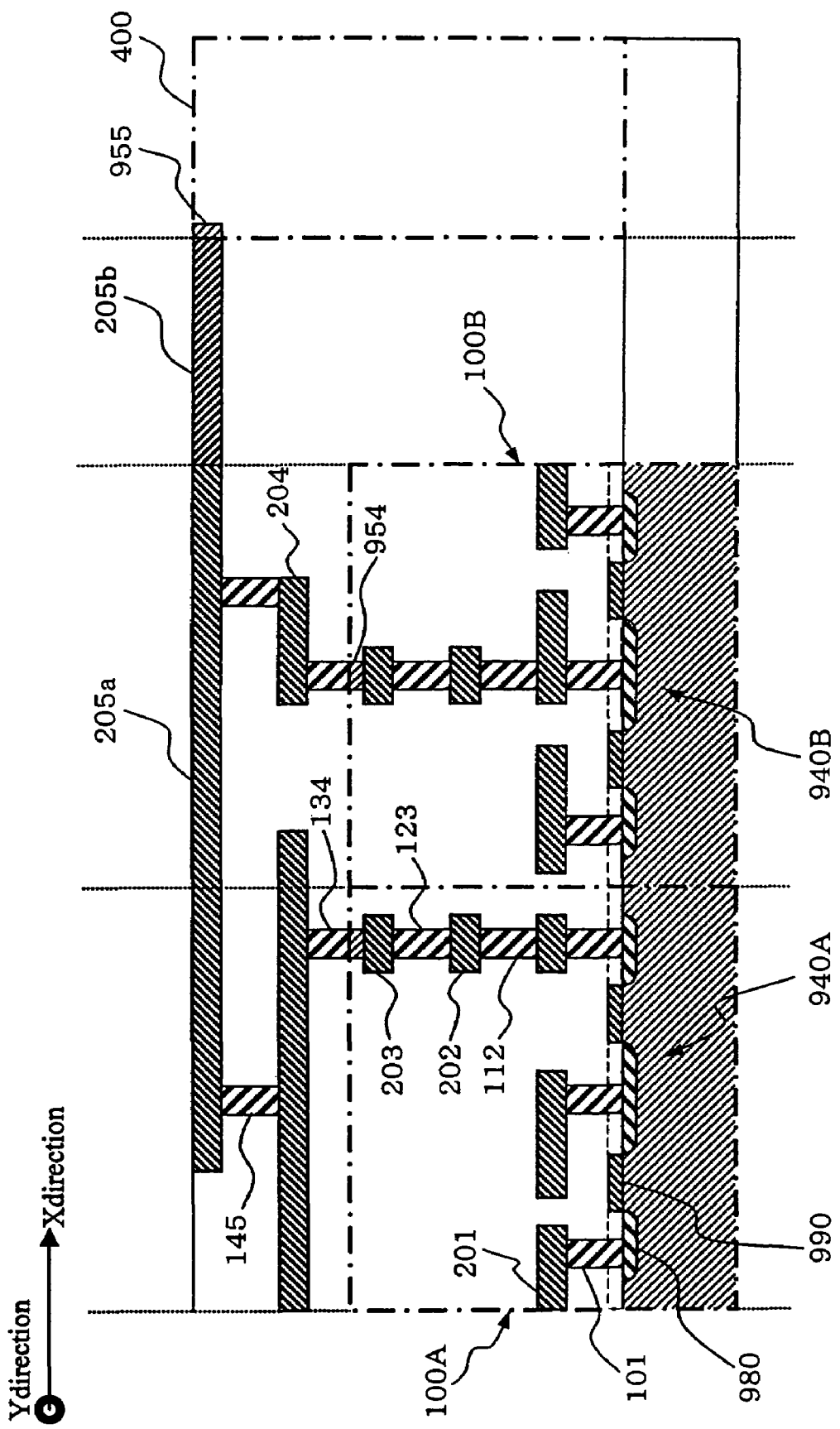
FIG. 1 is a sectional view showing a layout of gate array cells of Embodiment 1.

An LSI and a method of producing the same according to the present invention will be described by way of embodiments with reference to FIGS. 1 to 8. Components having the same configuration and function as those of the prior art shown in FIG. 9 are denoted with the same reference numerals as those therein, and the description thereof will not be repeated here.

Embodiment 1

FIG. 1 is a sectional view showing a layout of an LSI of Embodiment 1. Logic cells 100A and 100B have a configuration in which second wiring layers 202 and third wiring layers 203 are added to the logic cells 900A and 900B in FIG. 9. First wiring layers 201 and second wiring layers 202, and the second wiring layers 202 and third wiring layers 203, are connected to each other through contact VIAs 112 and contact VIAs 123, respectively. Connecting pins 954 are formed at the top portions. The logic cells 100A and 100B are connected to each other through contact VIAs 134, fourth wiring layers 204, contact VIAs 145, and a fifth wiring layer 205a. The logic cell 100B is connected to a functional block 400 through a fifth wiring layer 205b and a connecting pin 955.

As described above, only three wiring layers are disposed in the conventional logic cell regions, whereas five wiring layers are disposed in the regions of the logic cells 100A and 100B, and the logic cells 100A and 100B are formed by using up to the lower three wiring layers. By using the upper two wiring layers for connecting the logic cells to each other, a diffusion process up to the third wiring layer can be completed until the logic design of an LSI starts and a mask for the wiring layers is produced. Therefore, it becomes possible to prevent an increase in the production period for an LSI and the number of correction masks, caused by the increase of a number of wiring layers.

Embodiment 2

Figure 2:
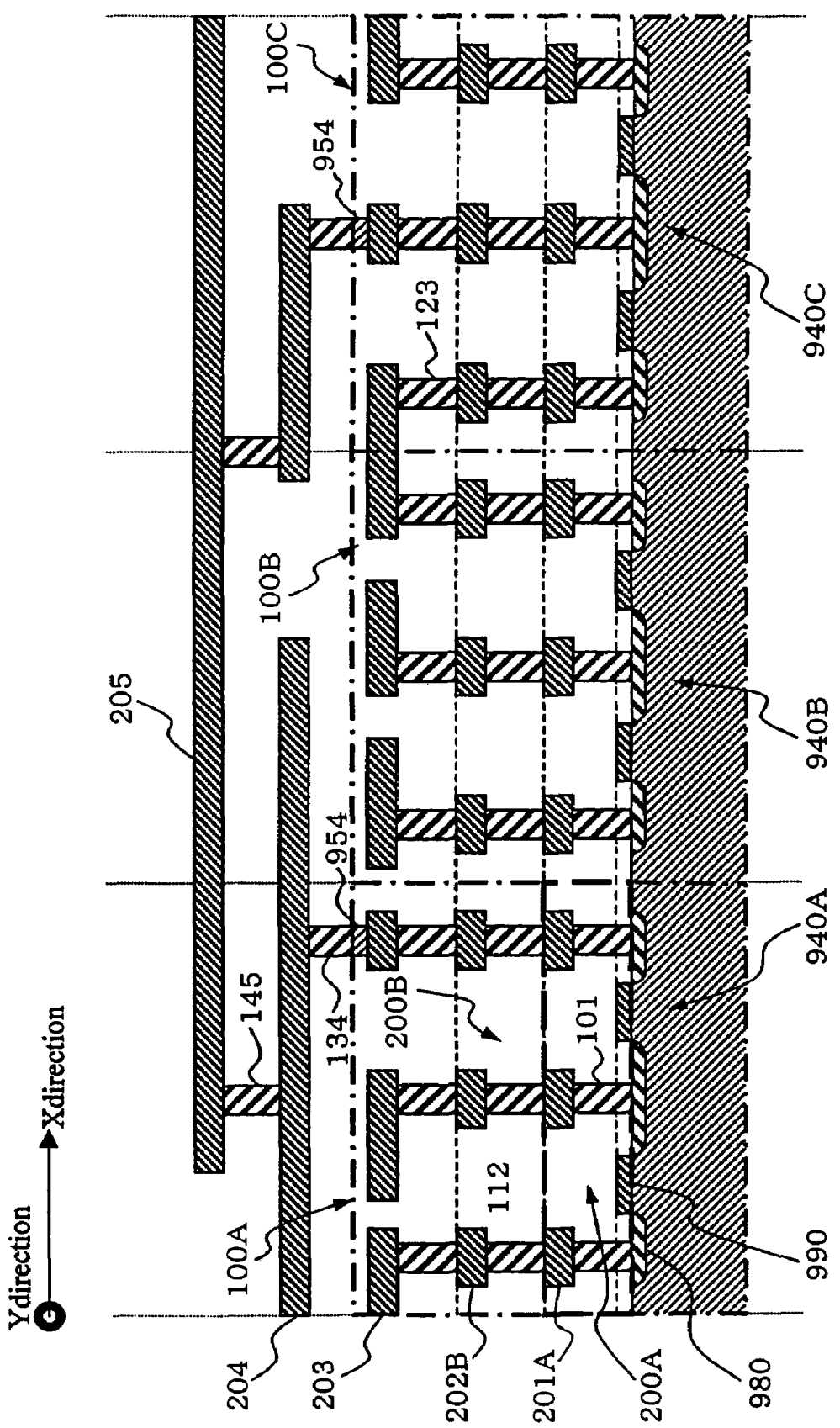
FIG. 2 is a sectional view showing a layout of gate array cells of Embodiment 2.

FIG. 2 is a structural view showing a layout of an LSI of Embodiment 2. In the present embodiment, in the regions of the logic cells 100A, 100B, and 100C, since five wiring layers are arranged, and connection cells 200A and 200B are inserted into lower two layers, upper three wiring layers can be corrected.

Figure 3C:
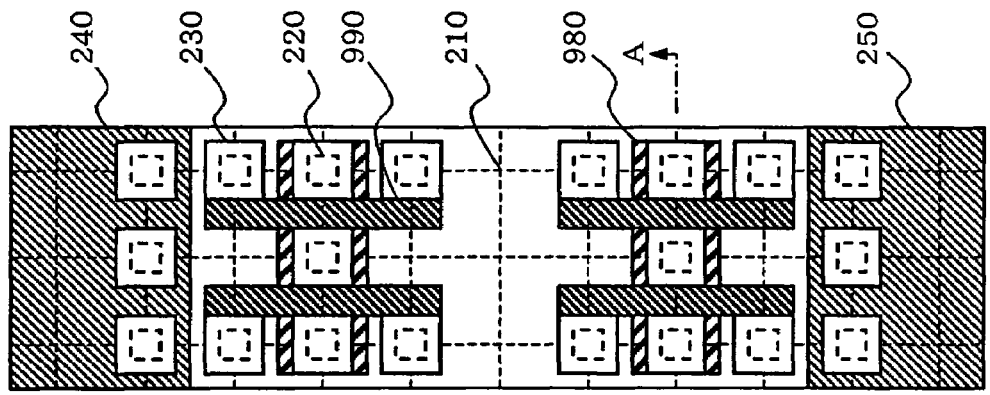
FIGS. 3A to 3C show a configuration of a connection cell in the gate array cells in FIG. 2.
Figure 3B:
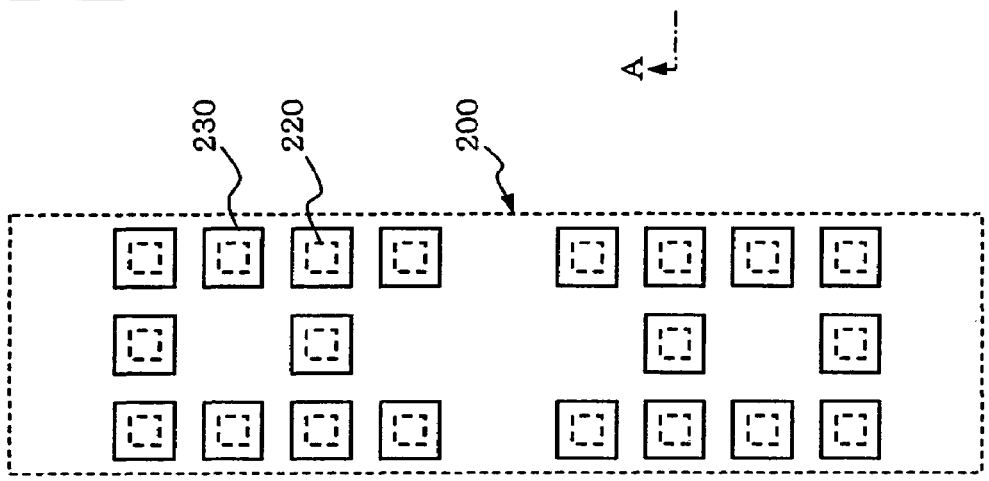
Figure 3A:
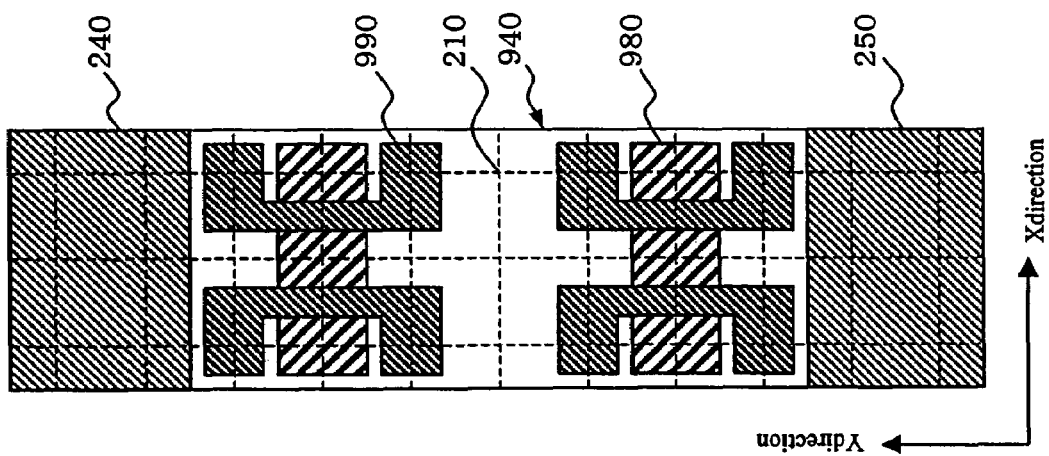

FIG. 3B shows a configuration of a connection cell 200 (200A or 200B in FIG. 2). The connection cell 200 is composed of contact VIAs 220 (101 or 112 in FIG. 2) and wiring patterns 230 (201A or 202B in FIG. 2) disposed immediately above the contact VIAs 220 and connected thereto. The contact VIAs 220 are disposed at positions corresponding to arbitrary grids 210 of base cells 940 (940A, 940B, or 940C in FIG. 2) as shown in FIG. 3A. In FIG. 3A, reference numeral 240 denotes a power supply line and reference numeral 250 denotes a ground line. FIG. 3C shows a stacked state of the base cell 940 in FIG. 3A and the connection cell 200 in FIG. 3B. The line A-A in FIG. 3C shows a position of a cross section shown in FIG. 2.

As shown in FIG. 2, in the logic cells 100A, 100B, and 100C, the base cells 940A, 940B and 940C are connected to the third wiring layers 203 through the connection cells 200A and 200B and the contact VIAs 123, respectively. The logic cells 100A and 100C are provided with the connecting pins 954 on the top surfaces. The logic cells 100A and 100C are connected to each other through the contact VIAs 134, the fourth wiring layers 204, the contact VIAs 145, and the fifth wiring layer 205.

Embodiment 3

Figure 4:
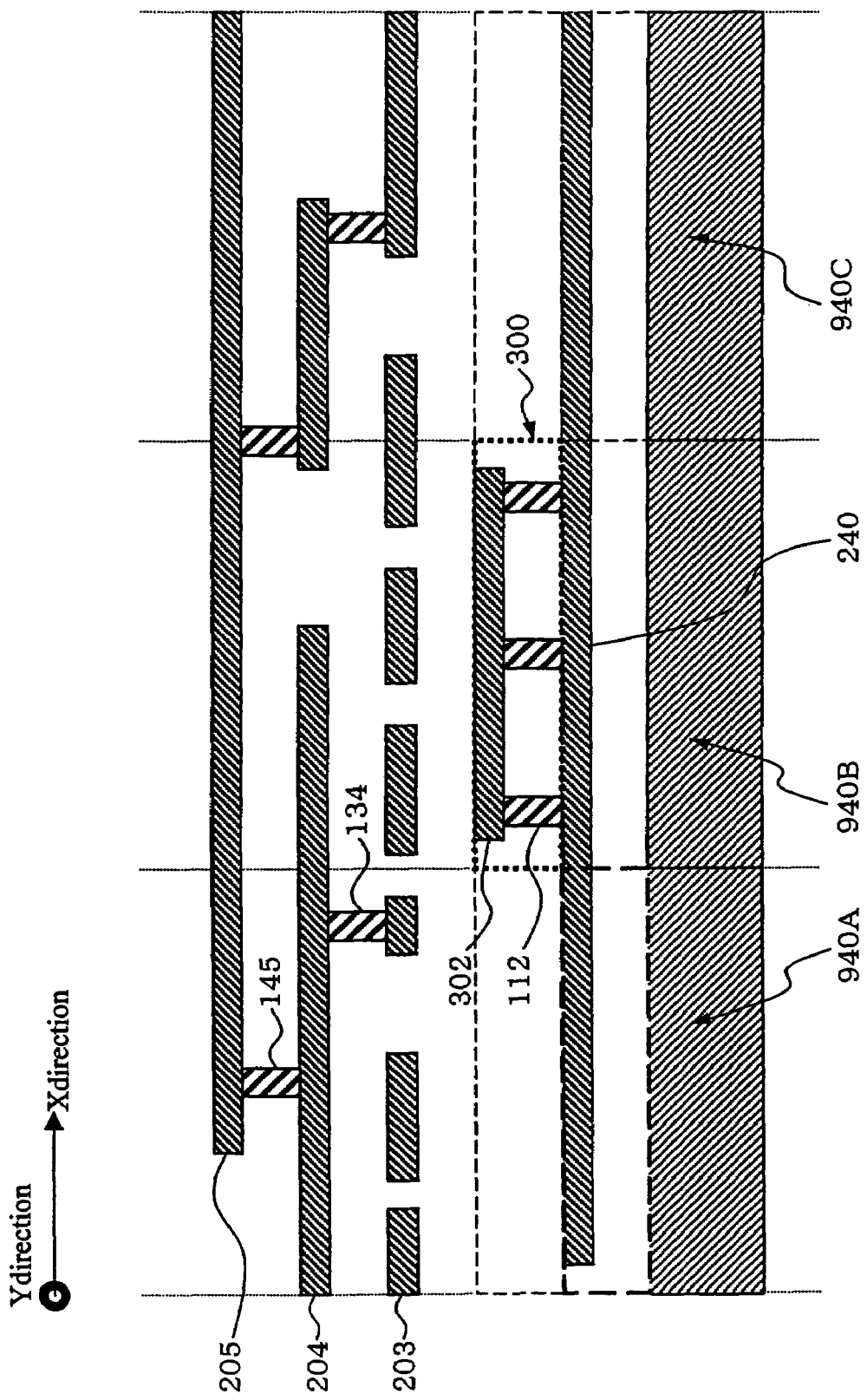
FIG. 4 is a sectional view showing a layout of gate array cells of Embodiment 3.

FIG. 4 shows a layout of an LSI of Embodiment 3. In the present embodiment, a power supply cell 300 is inserted for the purpose of strengthening a power supply line in accordance with previously calculated power consumption of a logic block. Thus, it becomes possible to arrange up to five wiring layers while only the upper three wiring layers are allowed to be corrected.

Figure 5C:
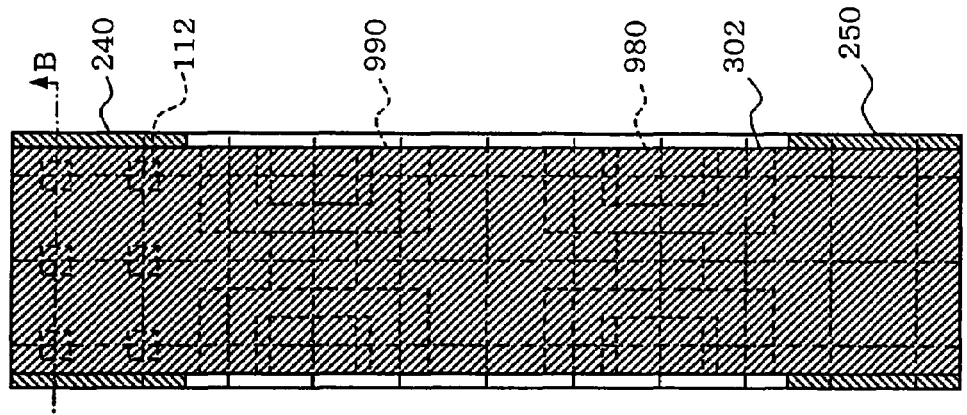
FIGS. 5A to 5C show a configuration of a power supply cell in the gate array cells in FIG. 2.
Figure 5B:
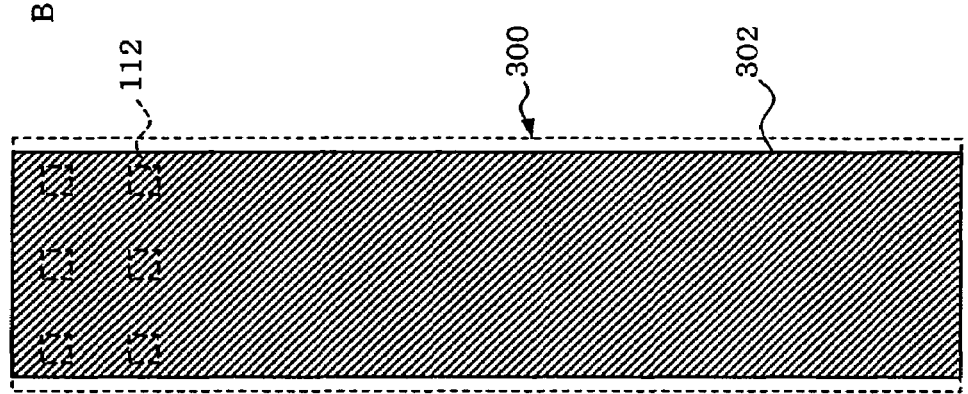
Figure 5A:
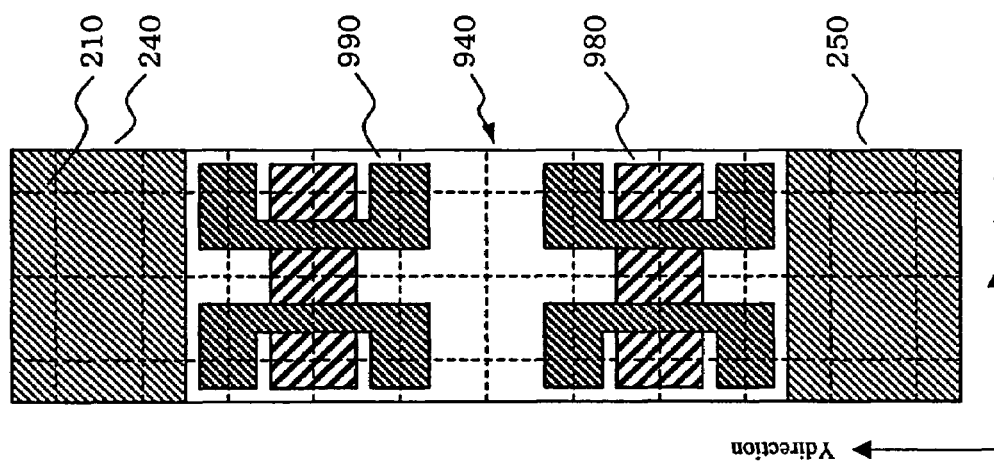

FIG. 5B shows a configuration of the power supply cell 300. The power supply cell 300 is composed of the contact VIAs 112 and a wiring pattern 302 connected to the contact VIAs 112 and cells adjacent thereto. The contact VIAs 112 are disposed at positions corresponding to at least one grid 210 in the power supply line 240 in the base cell 940 shown in FIG. 5A. FIG. 5C shows a stacked state of the base cell 940 in FIG. 5A and the power supply cell 300 in FIG. 5B. The line B-B in FIG. 5C indicates a position of a cross section shown in FIG. 4.

A GND cell also can be constituted in the same way as in the power supply cell 300. The GND cell is composed of contact VIAs disposed at a grid of the GND in the base cell and wiring patterns connected to the contact VIAs and cells adjacent thereto, whereby the GND cell can be used in the same way as in the above-described power supply cell 300.

In FIG. 4, the wiring patterns are connected to the cells adjacent thereto in the Y-direction. However, even when the wiring patterns are connected to the cells adjacent thereto in the X-direction, a similar function can be obtained.

Embodiment 4

Figure 6:
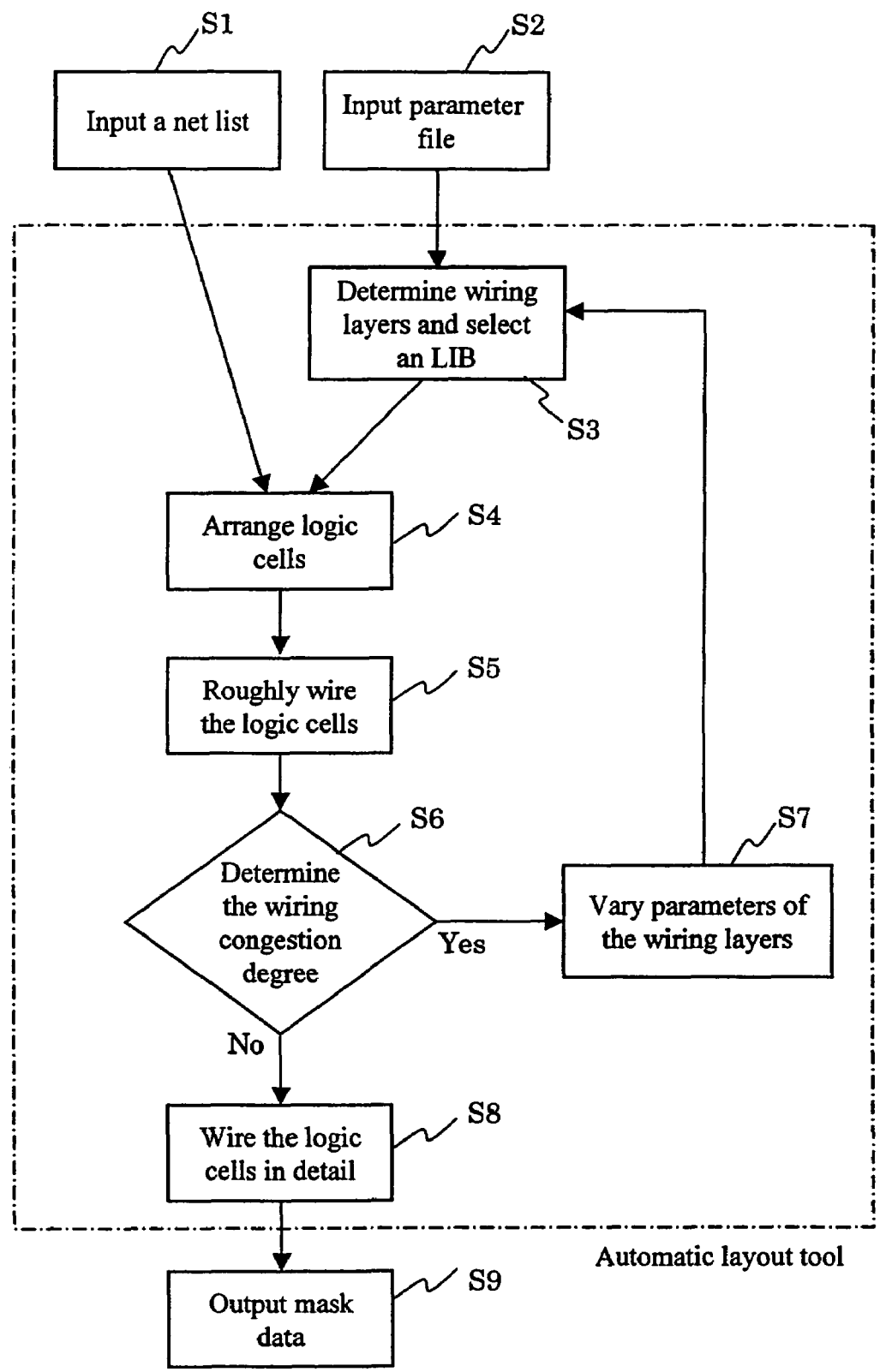
FIG. 6 is a flow chart showing a method of producing an LSI of Embodiment 4.

FIG. 6 is a flow chart showing a method of producing an LSI and an automatic layout flow in the production process in Embodiment 4. According to the production method of the present embodiment, when the connection cells described in Embodiment 2 or 3 are inserted into the LSI of Embodiment 1, the connection cells automatically are added or deleted in accordance with a wiring congestion degree.

According to the method, combinations LIB_K of the logic cells including the connection cells are prepared. Each of the combinations LIB_K includes K connection cells (K indicates one of integers from 1 to (m−n−1)), in accordance with each of the number of connection cells to be inserted. For example, the combination LIB_1 includes one connection cell, the combination LIB_2 includes two connection cells, and the combination LIB_(m−n−1) includes (m−n−1) connection cells. In the production process, each of the combinations LIB_K thus prepared is selected for use.

First, a net list and a parameter file are input (Steps S1 and S2). Next, based on a value of the parameter file, wiring layers are determined and the combinations LIB_K appropriate for the wiring layers are selected for use (S3). Then, logic cells are arranged (S4), and roughly are wired (S5). Here, the wiring congestion degree is determined (S6). When the wiring congestion degree is higher or lower than a predetermined range, parameters of the wiring layers are varied (S7) and the wiring layers are determined and the combinations LIB_K are selected again (S3). Logic cells are arranged (S4) and roughly wired (S5). When the wiring congestion degree is determined to be within an appropriate range (S6), the logic cells are wired in detail (S8). Mask data is output based on the results (S9).

As described above, a necessary wiring resource can be secured by automatically varying the number of layers of the connection cells, based on the wiring congestion degree (net/base cell, or the like) between the logic cells.

Embodiment 5

Figure 7:
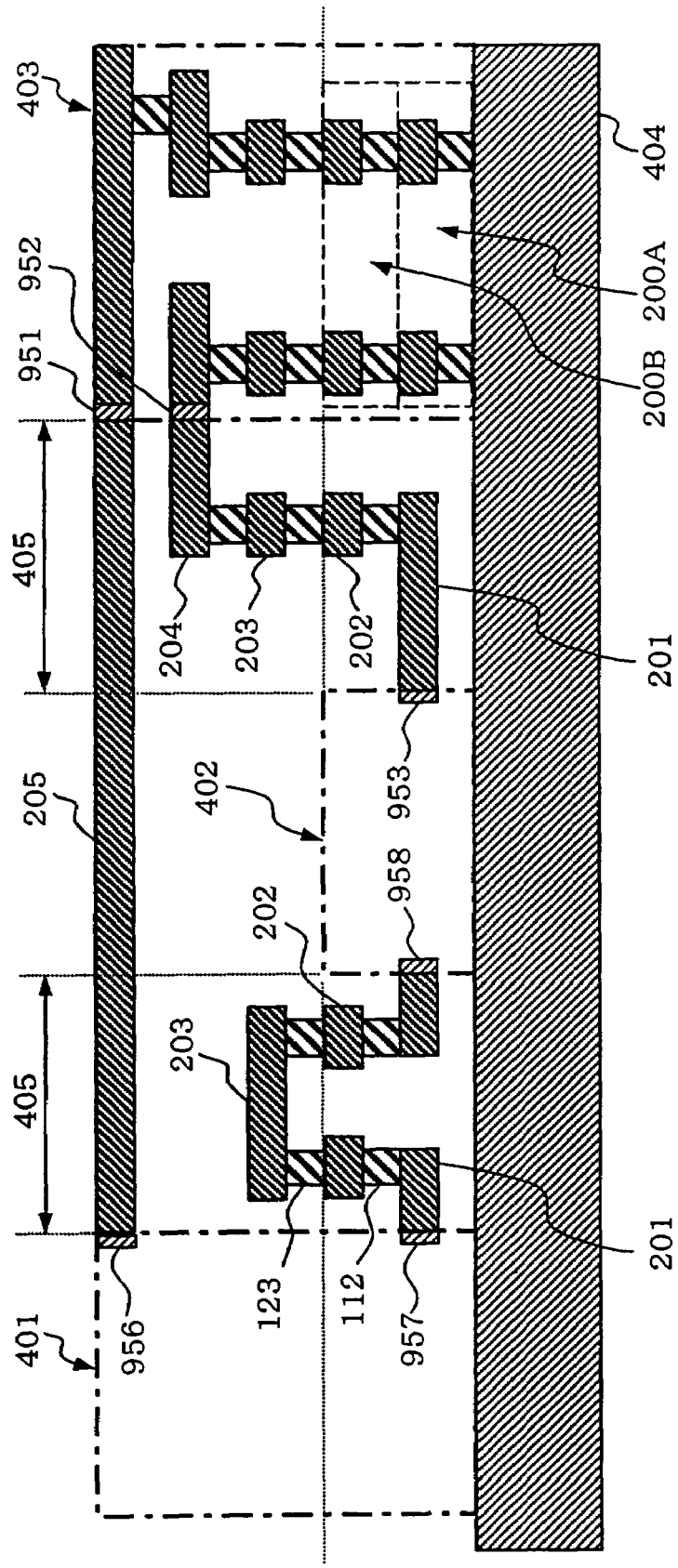
FIG. 7 is a sectional view showing a configuration of wiring between functional blocks produced by a method of producing an LSI of Embodiment 5.

FIG. 7 shows a configuration of wiring between functional blocks produced by a method of producing an LSI of Embodiment 5. Connecting pins 951 and 952 of a logic block 403 in a gate array type LSI of the present embodiment are positioned above third wiring layers. However, connecting pins of an existing functional block 401 composed of five wiring layers and connecting pins of an existing functional block 402 composed of two wiring layers, for example, are not necessarily formed on the same layer as that of connecting pins 951 and 952 of the logic block 403. Since the logic block 403 is designed last, when a gate array type LSI is designed, the design of the logic block 403 may cause the connection between the functional block 401 and the functional block 402 or the logic block 403 to be changed. Therefore, in the present embodiment, such a matter can be dealt with by specifying wiring layers in accordance with the logic block 403, that is, by allowing inter-block wiring to be conducted in the upper three layers.

A specific example of the above wiring method will be described in which the functional blocks 401 and 402 are constituted in a first wiring layer and connecting pins 957 and 958 are connected.

Figure 8:
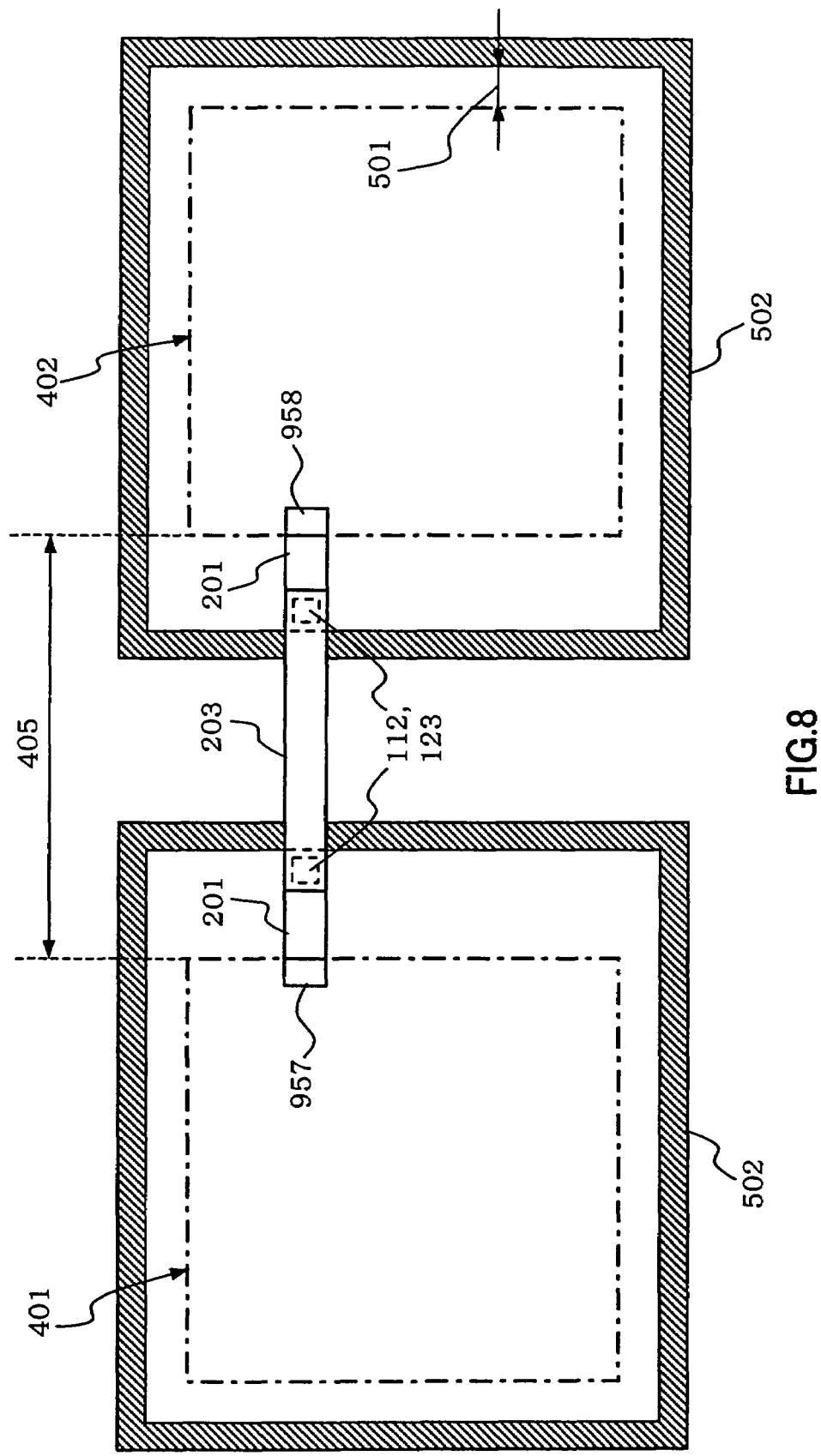
FIG. 8 is a plan view showing the configuration of wiring between the functional blocks in FIG. 7.
Figure 9:
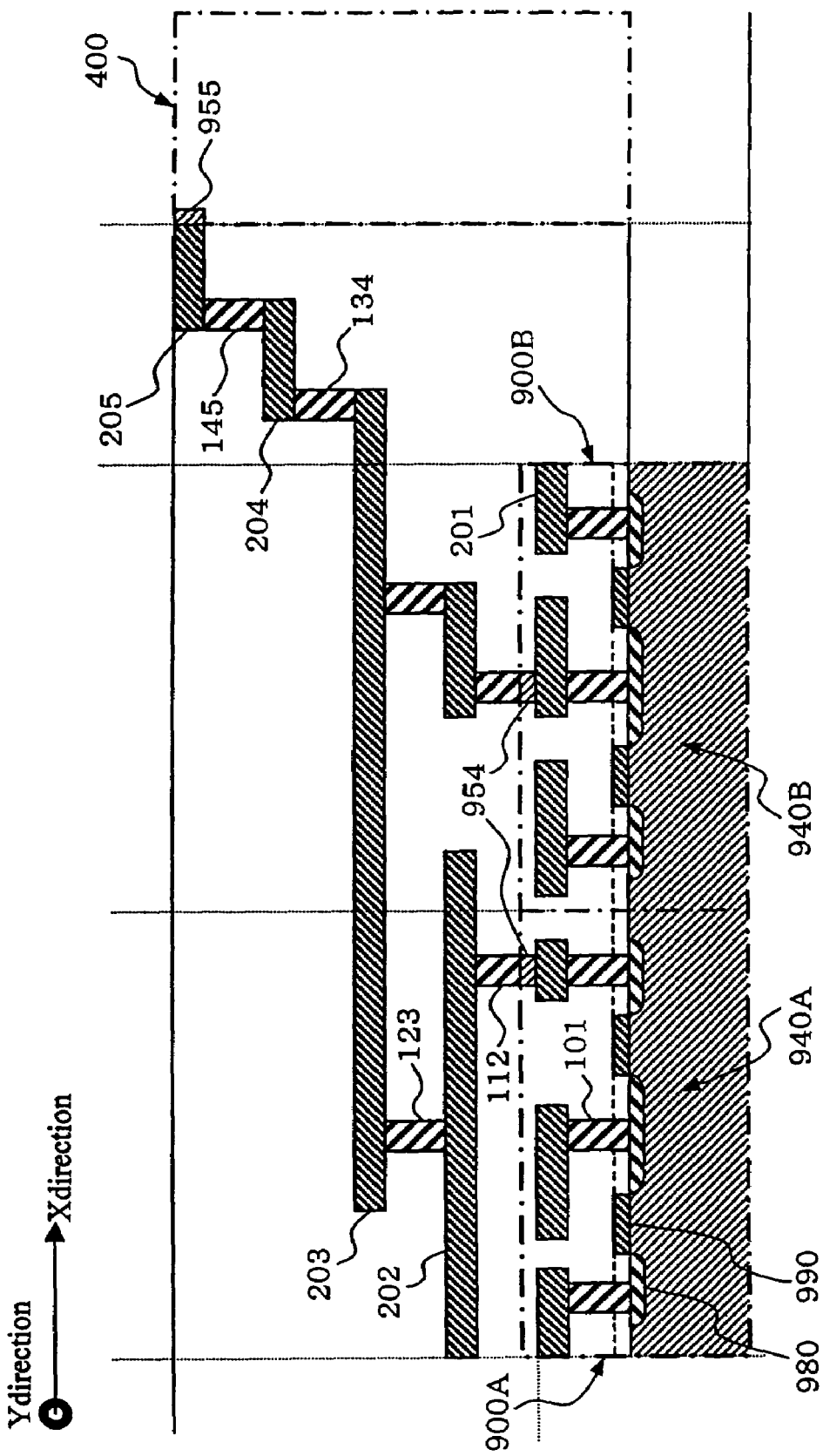
FIG. 9 is a sectional view showing a layout of conventional gate array cells.

First, as shown in FIG. 8, wiring prohibited regions 502 of lower two layers are provided around the functional blocks 401 and 402 formed on the silicon substrate 404. In an inter-block wiring region 405 upper three wiring layers are used at portions where the wiring prohibited regions 502 cross the wiring. That is to say, as shown in FIG. 7, the inter-block wiring region 405 is wired by the first wiring layers 201, the contact VIAs 112, the second wiring layers 202, the contact VIAs 123, and the third wiring layer 203. Reference numeral 501 in FIG. 8 denotes layer transfer regions.

In the same way, a connection between a connecting pin 953 of the functional block 402 and a connecting pin 952 of the logic block 403, and a connection between a connecting pin 956 of the functional block 401 and a connecting pin 951 of the logic block 403 also are made by using upper three wiring layers.

By using the above-described method of producing an LSI, when m wiring layers are included, it is possible to use n-th (n<m) or above wiring layers in at least one portion, so that inter-block wiring is corrected in upper n wiring layers.

As described above, according to the present invention, logic cells can be connected by varying upper n wiring layers, although logic cells are connected by using all wiring layers in the prior art. Consequently, when logic or wiring of an LSI composed of multi-layered wiring should be varied, only a few mask corrections are needed, so that a development period can be shortened and the development cost can be reduced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit device comprising:
   a plurality of logic cells composed of CMOS-type base cells arranged on a semiconductor substrate;
   m wiring layers, m being a natural number; and
   at least one functional block,
   wherein:
   at least one of a horizontal wiring connection within the logic cells and a horizontal wiring connection between the logic cells is present in the device, and any horizontal wiring connection within the logic cells and any horizontal wiring connection between the logic cells that are present are constituted only in n upper wiring layers among the m wiring layers, n being a natural number with n<m;
   lower (m−n) wiring layers comprise first contact vias and first wiring patterns connected to respective first contact vias;
   connection between the logic cells and the functional block, or between the functional blocks is conducted by using only the upper n wiring layers among m wiring layers;
   the semiconductor integrated circuit device further comprises at least one power supply cell comprising the CMOS-type base cell arranged on the semiconductor substrate and the m, n and (m−n) wiring layers, the lower (m−n) wiring layers of the at least one power supply cell comprise second contact vias disposed at positions corresponding to at least one grid of a power supply in the base cells and second wiring patterns connected to the second contact vias;

second wiring patterns of neighboring power supply cells are connected to each other; and the at least one power supply cell is positioned adjacent to at least one of the logic cells.

2. A semiconductor integrated circuit device of claim 1, wherein the n layers are uppermost wiring layers of the integrated circuit device.

3. The semiconductor integrated circuit device of claim 1, wherein (n−m) is more than 2.

4. A semiconductor integrated circuit device comprising:

a plurality of logic cells composed of CMOS-type base cells arranged on a semiconductor substrate;

m wiring layers, m being a natural number; and at least one fuctional block, wherein:

at least one of a horizontal wiring connection within the logic cells and a horizontal wiring connection between the logic cells is present in the device, and any horizontal wiring connection within the logic cells and any horizontal wiring connection between the logic cells that are present are constituted only in n upper wiring layers among the m wiring layers, n being a natural number with n<m;

lower (m−n) wiring layers comprise first contact vias and first wiring patterns connected to respective first contact vias;

connection between the logic cells and the functional block, or between the functional blocks is conducted by using only the upper n wiring layers among m wiring layers;

the semiconductor integrated circuit device further comprises at least one GND cell comprising the CMOS-type base cell arranged on the semiconductor substrate and the m, n and (m−n) wiring layers, the lower (m−n) wiring layers of the at least one GND cell comprise third contact vias disposed at positions corresponding to at least one grid of a GND in the base cell and third wiring patterns connected to the third contact vias; and third wiring patterns of neighboring GND cells are connected to each other; and the at least one GND cell is positioned adjacent to the at least one logic cells.

5. A semiconductor integrated circuit device comprising:

a plurality of logic cells composed of CMOS-type base cells arranged on a semiconductor substrate;

m wiring layers, m being a natural number; and at least one functional block, wherein:

at least one of a horizontal wiring connection within the logic cells and a horizontal wiring connection between the logic cells is present in the device, and any horizontal wiring connection within the logic cells and any horizontal wiring connection between the logic cells that are present are constituted only in n upper wiring layers among the m wiring layers, n being a natural number with n<m; and lower (m−n) wiring layers comprise connection cells comprising first contact vias and first wiring patterns disposed immediately above respective first contact vias and connected thereto, the first contact vias connecting all connection points to the upper n layers, the connection points including at least a gate, a source, a drain and substrate potential;

connection between the logic cells and the functional blocks, or between the functional blocks is conducted by using only the upper n wiring layers among m wiring layers;

the semiconductor integrated circuit device further comprises at least one power supply cell comprising the CMOS-type base cell arranged on the semiconductor substrate and the m, n and (m−n) wiring layers, the lower (m−n) wiring layers of the at least one power supply cell comprise second contact vias disposed at positions corresponding to at least one grid of a power supply in the base cell and second wiring patterns connected to the second contact vias;

second wiring patterns of neighboring power supply cells are connected to each other; and the at least one power supply cell is positioned adjacent to at least one of the logic cells.

6. A semiconductor integrated circuit device of claim 5, wherein the n layers are uppermost wiring layers of the integrated circuit device.

7. The semiconductor integrated circuit device of claim 5, wherein (n−m) is more than 2.

8. A semiconductor integrated circuit device comprising:

a plurality of logic cells composed of CMOS-type base cells arranged on a semiconductor substrate;

m wiring layers, m being a natural number; and at least one functional block, wherein:

at least one of a horizontal wiring connection within the logic cells and a horizontal wiring connection between the logic cells is present in the device, and any horizontal wiring connection within the logic cells and any horizontal wiring connection between the logic cells that are present are constituted only in n upper wiring layers among the m wiring layers, n being a natural number with n<m; and lower (m−n) wiring layers comprise connection cells comprising first contact vias and first wiring patterns disposed immediately above respective first contact vias and connected thereto, the first contact vias connecting all connection points to the upper n layers, the connection points including at least a gate, a source, a drain and substrate potential;

connection between the logic cells and the functional blocks, or between the functional blocks is conducted by using only the upper n wiring layers among m wiring layers;

the semiconductor integrated circuit device further comprises at least one GND cell comprising the CMOS-type base cell arranged on the semiconductor substrate and the m, n and (m−n) wiring layers, the lower (m−n) wiring layers of the at least one GND cell comprise third contact vias disposed at positions corresponding to at least one grid of a GND in the base cells and third wiring patterns connected to the third contact vias;

third wiring patterns of neighboring GND cells are connected to each other; and the at least one GND cell is positioned adjacent to the at least one logic cells.

9. A method of producing a semiconductor integrated circuit device having a configuration, comprising:

m wiring layers, m being a natural number; and at least one functional block, wherein:

at least one of a horizontal wiring connection within the logic cells and a horizontal wiring connection between the logic cells is present in the device, and any horizontal wiring connection within the logic cells and any horizontal wiring connection between the logic cells that are present are constituted only in n upper wiring layers among the m wiring layers, n being a natural number with n<m; and lower (m−n) wiring layers comprise connection cells comprising first contact vias and first wiring patterns disposed immediately above respective first contact vias and connected thereto, the first contact vias connecting all connection points to the upper n layers, the connection points including at least a gate, a source, a drain and substrate potential; and connection between the logic cells and the functional blocks, or between the functional blocks is conducted by using only the upper n wiring layers among m wiring layers;

the method comprising:

a first step of inputting a net list and a parameter file;

a second step of determining wiring layers based on parameters of the wiring layers in the parameter file that is input in the first step and selecting LIB_K including K connection cells appropriate for the determined wiring layers, K being a natural number;

a third step of arranging the logic cells using the LIB_K selected in the second step;

a fourth step of roughly determining wirings for the logic cells arranged in the third step; and a fifth step of estimating a wiring congestion degree after the rough wiring in the fourth step;

wherein when the wiring congestion degree is out of a predetermined range, the parameters of the wiring layers are changed and the second to fifth steps are repeated again, while when the degree of wiring congestion is within the predetermined range, the wirings are determined in detail and mask data is output based on the results of the wiring.

* * * * *